United States Patent
Zhang et al.

(10) Patent No.: US 12,235,311 B1
(45) Date of Patent: Feb. 25, 2025

(54) GRAPH THEORY-BASED METHOD AND DEVICE FOR LOCATING INSTABILITY FAULT SOURCE IN DIRECT-CURRENT MICROGRID

(71) Applicant: ZHEJIANG UNIVERSITY, Hangzhou (CN)

(72) Inventors: Xin Zhang, Hangzhou (CN); Xueqi Liu, Hangzhou (CN); Fanfan Lin, Hangzhou (CN); Hao Ma, Hangzhou (CN); Yuankui Wang, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 18/753,853

(22) Filed: Jun. 25, 2024

(30) Foreign Application Priority Data

Mar. 11, 2024 (CN) .......................... 202410272786.6

(51) Int. Cl.
*G01R 31/08* (2020.01)
(52) U.S. Cl.
CPC .......... *G01R 31/088* (2013.01); *G01R 31/086* (2013.01)
(58) Field of Classification Search
None
See application file for complete search history.

(56) References Cited

U.S. PATENT DOCUMENTS

2012/0298849 A1* 11/2012 He .......................... H01P 11/00
250/227.14
2015/0372596 A1* 12/2015 McJimsey ............... H02J 3/381
323/271

* cited by examiner

*Primary Examiner* — Farhana A Hoque
(74) *Attorney, Agent, or Firm* — Jiwen Chen; Joywin IP Law PLLC

(57) ABSTRACT

Disclosed in the present invention is a graph theory-based method for locating an instability fault source in a direct-current microgrid. The method includes: collecting key electrical feature quantities through an instability fault feature collection and extraction link to accurately capture an instability oscillation phenomenon, and utilizing wavelet packet decomposition to construct fault feature vectors; then, according to the structure of the direct-current microgrid, constructing an undirected graph model G=(V, E, X), which lays a foundation for analysis; applying a graph convolutional neural network for deep learning and training to further improve the accuracy and efficiency of diagnosis; deploying the trained model in an actual system to effectively achieve accurate fault diagnosis and location of an instability source. Also provided in the present invention is a device for locating an instability fault source in a direct-current microgrid. The method provided by the present invention can significantly improve a maintenance level of the direct-current distribution network, and greatly improve a detection and adjustment ability of system operation stability through advanced automatic diagnosis technology.

6 Claims, 3 Drawing Sheets

GRAPH THEORY-BASED METHOD AND DEVICE FOR LOCATING INSTABILITY FAULT SOURCE IN DIRECT-CURRENT MICROGRID

This application claims priority of Chinese Application No. 202410272786.6, filed Mar. 11, 2024, which is hereby incorporated by reference.

FIELD OF TECHNOLOGY

The present invention belongs to the technical field of a fault detection in a direct-current grid, in particular relates to a graph theory-based method and device for locating an instability fault source in a direct-current microgrid.

BACKGROUND TECHNOLOGY

A direct-current microgrid is a small power system consisting of a variety of distributed energy sources, loads and energy storage devices and can operate independently or by connecting to a main power grid. The direct-current microgrid is designed to improve utilization efficiency of energy sources, support integration of renewable energy sources, and provide greater power supply reliability.

Although each converter in the system is stable in an independent design and test phase, when they are combined to form a direct-current distribution system and start operation, interaction and mismatch among different converters may cause oscillation of the entire system, and even cause the system to be unstable. This instability not only causes a significant damage to the system, but can also affect overall operational efficiency. Therefore, it is important to accurately locate an instability fault source to guide subsequent maintenance and repair. However, current researches on locating the instability fault source are relatively limited, and there is a lack of widely applicable automated solutions. The research in this field not only has a theoretical value, but also has important significance for practical applications.

A patent document CN114239198B discloses a method and device for dividing a grid sub-graph based on parallel optimization. The method comprises: according to a topology structure of a power system, taking lines among devices used in a grid as nodes and edges to form a natural grid topology structure graph; then, roughly dividing the given grid topology into a series of smaller sub-regions, and then dividing each sub-region to obtain an optimal solution; and finally, utilizing a reverse algorithm to restore the sub-regions to obtain an optimal partition of the given graph.

A patent document CN117312611A discloses a method for rapid locating and diagnosing a power fault and a related device, comprising the following steps: constructing a causality relationship between a power fault and a symptom based on operation and maintenance historical data; based on the causality relationship between the power fault and the symptom, establishing a tree-type causality graph model and storing the tree-type causality graph model in a form of tree structure storage; quickly locating an abnormal device based on the tree-type causality graph model and alarm information; performing power fault diagnosis on alarm symptom information of quickly located abnormal device based on the tree-type causality graph model; and updating regularly the tree-type causality graph model based on a power fault diagnosis result. By constructing the tree-type causality graph model, the abnormal device is quickly located to perform the power fault diagnosis based on the alarm information, and the fault device can be accurately located and the power fault is diagnosed accurately.

SUMMARY OF THE INVENTION

The object of the present invention is to provide a graph theory-based method and device for locating an instability fault source in a direct-current microgrid. This method is suitable for a task of determining instability fault sources of different types of direct-current microgrid structures.

In order to realize a first invention object of the present invention, a graph theory-based method for locating an instability fault source in a direct-current microgrid is provided, which comprises the following steps:

obtaining electrical data of each power electronic converter in the direct-current microgrid, and processing the electrical data to obtain a corresponding feature vector;

constructing a graph model based on the direct-current microgrid, wherein the graph model takes the power electronic converters as nodes, power flow paths among all the power electronic converters as edges among the nodes, and the feature vectors corresponding to the power electronic converters as a node feature matrix;

according to whether the direct-current microgrid is unstable, labeling the electrical data of the power electronic converters, and combining the electrical data and labels of the power electronic converters into data sets;

introducing the graph model into a pre-constructed graph convolutional neural network framework to construct a corresponding classification network, which comprises a feature extraction module, a feature fusion module, and a classification module, wherein the feature extraction module is configured to obtain electrical change data of the power electronic converters and position information in the corresponding graph model to generate a feature vector corresponding to the electrical change data and a node vector corresponding to the position information;

the feature fusion module is configured to generate a corresponding node feature representation according to the generated feature vector and node vector; and the classification module is configured to output a classification result according to the input node feature representation, wherein the classification result comprises whether a direct-current grid is unstable and an instability fault source;

utilizing the data set to train the classification network to obtain a grid diagnosis model for instability diagnosis of the direct-current grid; and inputting the electrical data of each power electronic converter of the direct-current grid to be diagnosed into the grid diagnosis model to output a judgment result of whether the direct-current grid is unstable and an existing instability fault source.

The present invention constructs the corresponding graph model by taking each power electronic converter in the direct-current microgrid as a node, and introduces the edges among all nodes in the graph model and the feature vector of the electrical data into the graph convolutional neural network framework to construct the grid diagnosis model for diagnosing the instability of the direct-current grid.

Specifically, a specific process of processing the electrical data is as follows: setting a wavelet basis function based on energy entropy to perform multi-layer decomposition on the electrical data through the wavelet basis function, and calculating the energy of sub-bands after the multi-layer decomposition to construct the corresponding feature vector.

Specifically, the electrical data comprises a current signal and a voltage signal.

Specifically, a specific structure of the graph model is as follows:
setting G=(V, E, X) to represent an attribute graph in the graph model, wherein V represents a set of the nodes, that is, one power electronic converter represents one node; and N is a total number of the nodes;
E represents a set of the edges among the nodes, that is, the power flow paths among all the power electronic converters are taken as node edges, and is represented by an adjacency matrix A and meets $A \in \square^{N \times N}$; when there is a power flow between a node i and a node j and i≠j, a matrix $A_{ij}$ is set to 1, and otherwise the matrix $A_{ij}$ is set to 0; and in addition, $A_{ii}$ is set to 1; and X represents the node feature matrix, and meets $X \in \square^{N \times C}$; and C represents feature dimensions of the nodes.

Specifically, an expression of the node feature representation is as follows:

$$H = D^{-\frac{1}{2}} A D^{-\frac{1}{2}} X W$$

D represents a degree matrix, each $$D_{ii} = \sum_{j=1}^{N} A_{ij};$$

A represents an updated adjacency matrix, $A \in \square^{N \times N}$; X represents the node feature matrix, $X \in \square^{N \times C}$; N represents a total number of the nodes; W represents a weight matrix, $W \in \square^{C \times F}$; F represents feature vector dimensions extracted by all the convolution layers; and H represents node feature representation extracted by convolution of all the convolution layers, $H \in \square^{N \times F}$.

Specifically, the weight matrix is constructed by comparing feature vectors of two nodes connected by each edge between nodes, which is specifically as follows: if feature vectors of the nodes at both ends of the edge are different, defining a weight as 1; and if feature vectors of the nodes at both ends of the edge are same, defining the weight as 0.

Therefore, the data is optimized to improve a convergence speed of the algorithm.

Specifically, during training, parameters of the classification network are updated by using a cross entropy loss function, wherein an expression of the cross entropy loss function is as follows:

$$O = \frac{1}{N} \sum_{i=1}^{N} (\hat{y}_i, y_i)$$

$\hat{y}_i$ represents a predicted label of a node i, $\hat{y}_i$ represents an actual label of the node i, and N is a total number of the nodes.

In order to realize a second invention object of the present invention, a device for locating an instability fault source in a direct-current microgrid is provided, which comprises a computer memory, a computer processor and a computer program stored in the computer memory and executable on the computer processor, wherein the computer memory adopts any one of the above-mentioned graph theory-based methods for locating an instability fault source in a direct-current microgrid; and the following steps are implemented when the computer processor executes the computer program: inputting the electrical data of each power electronic converter of the direct-current grid to be diagnosed into the grid diagnosis model to output a judgment result of whether the direct-current grid is unstable and an existing instability fault source.

Compared with the prior art, the present invention has the following beneficial effects:

The graph model is utilized to replace the direct-current microgrid structure, which is convenient to locate the instability fault nodes in the direct-current microgrid, and provides more comprehensive guidance for the subsequent daily maintenance.

DESCRIPTION OF THE EMBODIMENTS

In order to make the purpose, technical solution and advantages of embodiments of the present invention more clear, the technical solution in the embodiments of the present invention will be described clearly and completely in combination with the drawings attached to the embodiments of the present invention. Obviously, the described embodiments are only a part of the embodiments of the present invention, but not all the embodiments. Components of the embodiments of the present invention commonly described and shown herein may be arranged and designed in a variety of different configurations. Accordingly, the following detailed description of the embodiments of the present invention provided in the attached drawings is not intended to limit the protection scope of the present invention, but merely represent selected embodiments of the present invention. Based on the embodiments of the present invention, all other embodiments obtained by a person skilled in the art without making creative labor fall within the protection scope of the present invention.

Figure 1:
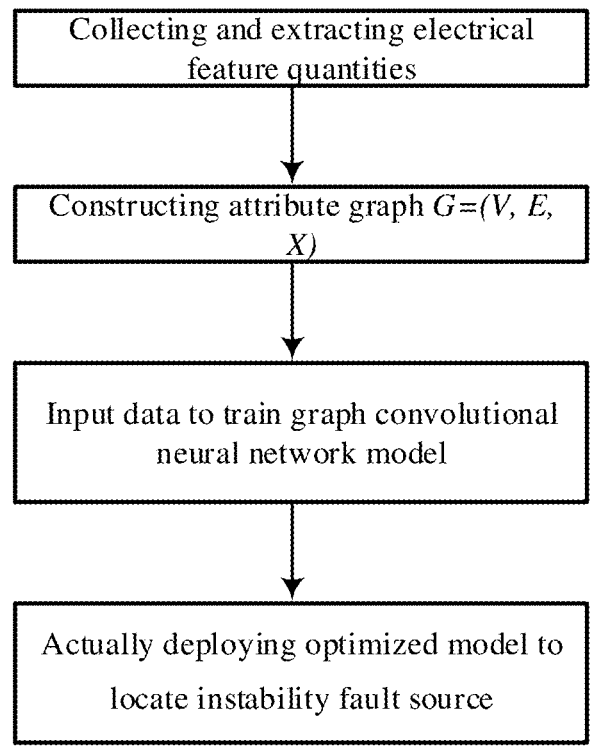
FIG. 1 is a flowchart of a graph theory-based method for locating an instability fault source in a direct-current microgrid provided in an embodiment.

As shown in FIG. 1, a graph theory-based method for locating an instability fault source in a direct-current microgrid is provided for an embodiment. This method is mainly aimed at an instability problem caused by an impedance mismatch of converters in a power electronic system, seizing its voltage and current oscillation characteristics, accurately locating unstable converters, and providing guidance for subsequent fault repair, wherein the method comprises the following steps:

Collecting electrical data of each power electronic converter in the direct-current microgrid, and after collecting the electrical data, extracting an electrical feature quantity of each power electronic converter using a fault feature extraction algorithm, that is, a feature vector of each power electronic converter after extraction being $X_i=\{x_{i1}, x_{i2}, x_{i3}, \ldots, x_{iC}\}$, wherein C is a feature dimension.

More specifically, first of all, the electrical feature quantities such as voltage, current and other signals are collected from each module, and these signals are preprocessed by filtering, normalization and other operations to remove an invalid signal.

Secondly, an appropriate wavelet basis function is selected based on energy entropy, such as Symlets or Coiflets.

Then, a signal driven decomposition strategy is adopted. According to the specific characteristics of the signals (such as non-stationarity, peak values), the decomposition strategy is designed to perform multi-layer decomposition on the signals by wavelet packet transformation.

Finally, the energy of the sub-bands after the multi-layer decomposition is calculated, and a C-dimensional energy feature vector is constructed. All the collected feature vectors constitute data samples.

Figure 2:
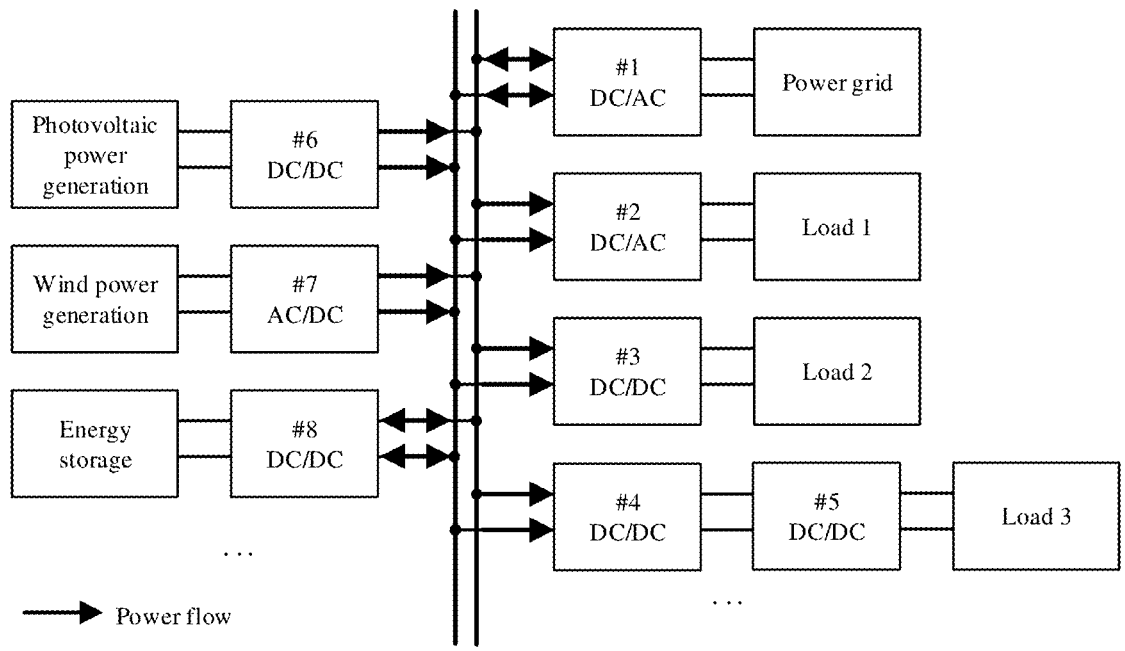
FIG. 2 is a simplified diagram of the direct-current microgrid provided in the embodiment.

As shown in FIG. 2, a direct-current microgrid structure provided for the embodiment comprises a bus, and the bus is connected with a plurality of various power supply units, such as a power supply grid, a photovoltaic power generation equipment, a wind power generation equipment and a supporting energy storage system, in addition to various electrical loads.

Figure 3:
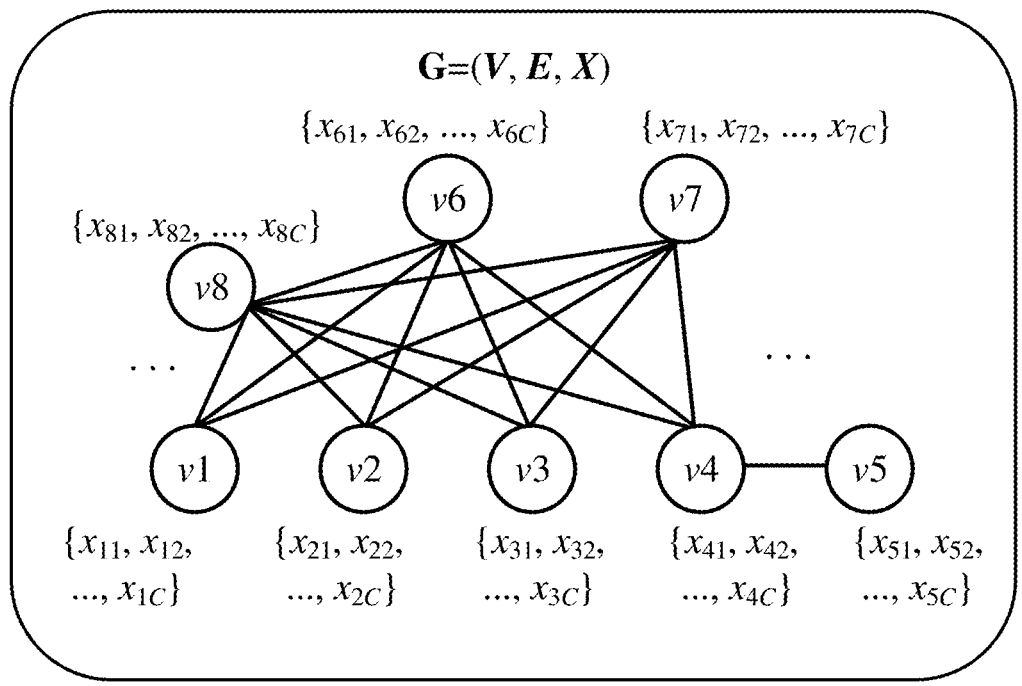
FIG. 3 is a schematic diagram of a diagram model provided in the embodiment.

As shown in FIG. 3, it is a graph model constructed by the direct-current microgrid structure shown in FIG. 2, wherein each node (V1, V2, V3, V4, V5, V6, V7, V8) in FIG. 3 corresponds to the power supply units or converters used by the electrical loads in FIG. 2, and connecting lines among the nodes indicate existence of power flows. Each node has a corresponding node matrix (an electrical feature vector extracted by the wavelet packet transformation, of which the dimension is C), and its specific construction process is as follows: Constructing a property graph G=(V, E, X), wherein V is a set of the nodes, one power electronic converter represents one node, and N is a total number of the nodes; E is a set of edges among the nodes, and the presence of power flows among the nodes represents the existence of edge connections. The set corresponds to an adjacency matrix A, $A \in \square^{N \times N}$, which is used to describe connection relationships among all nodes. If there is a power flow between node i and node j (i≠j), a position of the matrix $A_{ij}$ is 1, and if there is no connection, it is 0. $A_{ii}$ is set to 1.

In addition, in order to further simplify the plan, the adjacency matrix is updated. An update rule is as follows: comparing feature vectors of two nodes connected by an edge between nodes; if the feature vectors of the nodes at both ends of the edge are different, defining a corresponding position in the matrix as 1; if the feature vectors of the nodes at both ends of the edge are the same, defining a corresponding position in the matrix as 0.

X is a node feature matrix. Meeting $X \in \square^{N \times C}$, wherein C is the feature dimension of each node.

According to whether the direct-current microgrid is unstable, the electrical data of the power electronic converters is labeled, and the electrical data and labels of the power electronic converters are combined into data sets.

Figure 4:
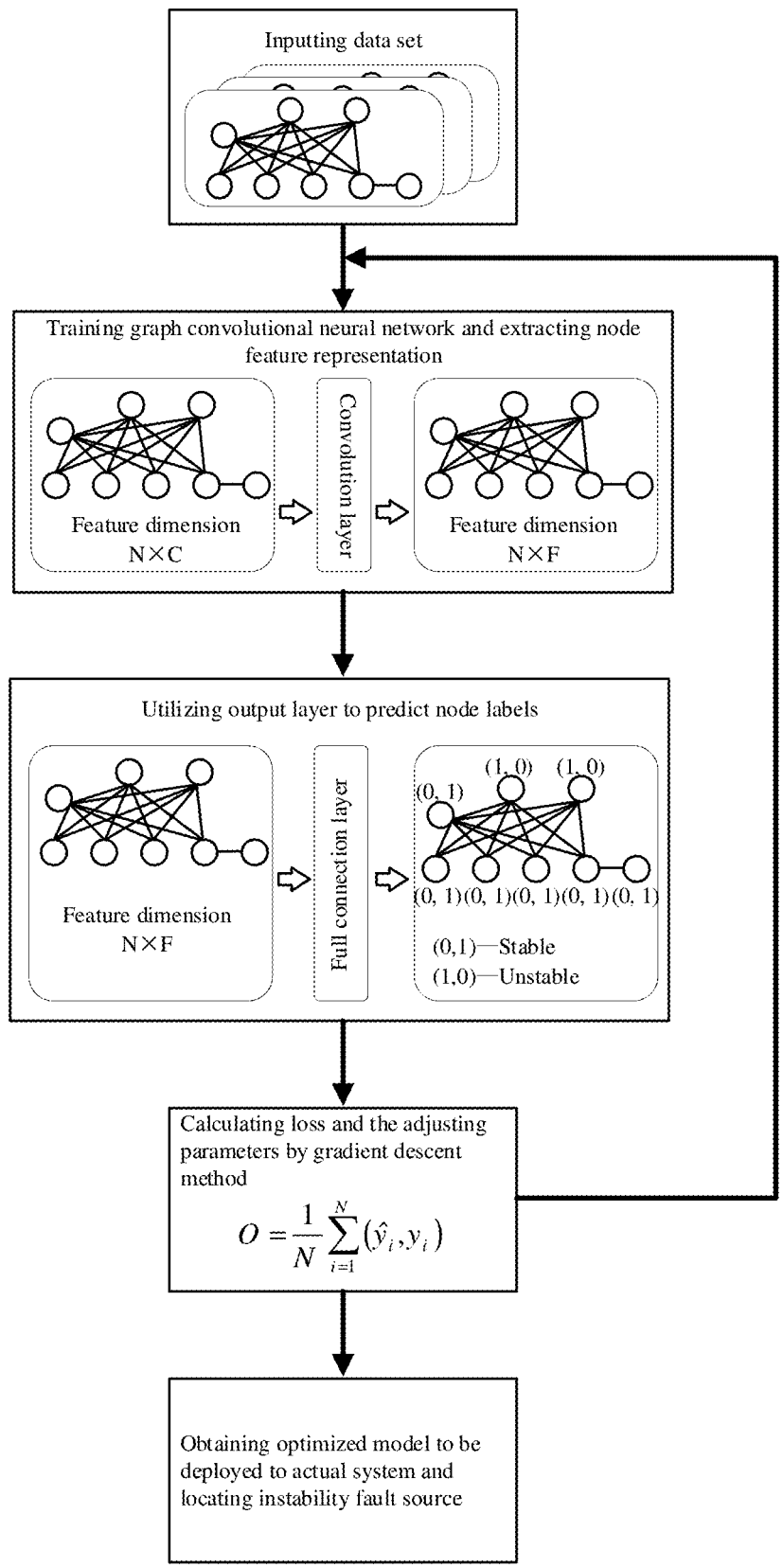
FIG. 4 is an operating flowchart of a classification network in the embodiment.

The graph model and data sets are introduced into a graph convolutional neural network framework to construct a corresponding classification network, which comprises a feature extraction module, a feature fusion module and a classification module. An operating flowchart of the classification network is shown in FIG. 4.

The feature extraction module is configured to obtain electrical change data of the power electronic converters and position information in the corresponding graph model to generate a feature vector corresponding to the electrical change data and a node vector corresponding to the position information;

the feature fusion module is configured to generate a corresponding node feature representation according to the generated feature vector and node vector; and the classification module is configured to output a classification result according to the input node feature representation, wherein the classification result comprises whether a direct-current grid is unstable and an instability fault source.

The data set are utilized to train the classification network to obtain a grid diagnosis model for instability diagnosis of the direct-current grid. The grid diagnosis model transforms the nodes and edges of the system into a format suitable for processing of the graph convolutional neural network, and the node features are obtained from an instability fault feature collection and extraction module. Then, according to different instability fault data of different direct-current microgrids, fault sample data sets are established, which are divided into a training set and a verification set, and node labels are divided into normal and instability fault conditions.

Using the graph convolutional neural network architecture based on a spectral domain method, a corresponding graph convolutional neural network layer number, an activation function and so on are designed. Setting a total number of layers of the neural network to be K and the activation function to be an ReLU function.

Each sample G=(V, E, X) of the training set is input, and node feature representation H is extracted from K−1 convolution layers, and H meets the relation.

$$H = D^{-\frac{1}{2}} A D^{-\frac{1}{2}} X W$$

D represents a degree matrix, each $$D_{ii} = \sum_{j=1}^{N} A_{ij};$$

A represents an updated adjacency matrix, $A \in \square^{N \times N}$; X represents the node feature matrix, $X \in \square^{N \times C}$; N represents a total number of the nodes; W represents a weight matrix, $W \in \square^{C \times F}$; F represents feature vector dimensions extracted by all the convolution layers; and H represents node feature representation extracted by convolution of all the convolution layers, $H \in \square^{N \times F}$.

Specifically, a relationship between a feature representation $H_i^k$ of an i-th node output from a k-th layer and the input meets:

$$H_i^k = \sigma \left( \sum_{j \in L(i)} \frac{A_{ij}}{\sqrt{D_{ii} D_{jj}}} H_j^{k-1} W^k + \frac{1}{D_{ii}} H_i^{k-1} W^k \right)$$

wherein, $A_{ij}$ is a weight of each edge in the adjacency matrix; $D_{ii}$ and $D_{jj}$ are degree values on the diagonal of the degree matrix; L(i) represents all nodes connected to i; $W^k$ represents a weight of the k-th layer; $H_i^{k-1}$ is a feature representation output from the i-th node in a k−1-th layer; σ(.) is the activation function ReLU.

Through an output full connection layer, a Softmax function is utilized for classification prediction, and prediction labels of the nodes are expressed as ŷ.

A loss function is constructed according to the output prediction labels and actual node labels, and the loss function is constructed as follows:

$$O = \frac{1}{N}\sum_{i=1}^{N}(\hat{y}_i, y_i)$$

wherein $\hat{y}_i$ is a prediction label of a node i, $\hat{y}_i$ is an actual label of the node i, N is the number of nodes, loss(, ) is a cross entropy loss function, and the weight matrix W is reversely adjusted by a gradient descent method.

The data set is utilized to train the classification network to obtain a grid diagnosis model for instability diagnosis of the direct-current grid; and inputting the electrical data of each power electronic converter of the direct-current grid to be diagnosed into the grid diagnosis model to output a judgment result of whether the direct-current grid is unstable and an existing instability fault source.

The following example is analyzed in a real system. A specific composition of the system comprises: a photovoltaic module, an energy storage module, and a load module 1. Included converters are one Boost converter (one end is connected to a solar panel, and one end is connected to a direct-current bus), one four-switch Buck-Boost converter (one end is connected to an energy storage device, and one end is connected to the direct-current bus), and one phase-shifted full-bridge converter (one end is connected to the direct-current bus and the other end is connected to a direct-current load).

The types of instability faults can be divided into converter single operation instability and converter cascade operation instability, so in this system, the types of instability faults comprises: only Boost converter instability, only four-switch Buck-Boost converter instability, only phase-shifted full-bridge converter instability, instability of both a Boost converter and a Buck-Boost converter due to an impedance mismatch, instability of both a Boost converter and a phase-shifted full-bridge converter due to an impedance mismatch, instability of both a Buck-Boost converter and a phase-shifted full-bridge converter due to an impedance mismatch, and instability of all of a Boost converter, a Buck-Boost converter and a phase-shifted full-bridge converter, which are 7 types in total.

A traditional instability determination method based on impedance determination can only diagnose the transformer cascade operation instability, and can not accurately locate which converters fall in cascade operation instability.

However, the method for locating an instability fault source in a direct-current microgrid provided by the above embodiment is used to locate the instability fault source in the direct-current microgrid system, and the specific steps are as follows:

S1. collecting electrical data of three converters in the direct-current microgrid respectively, comprising collecting output current and input current signals in this system, and preprocessing these signals by filtering, normalization and other operations to remove invalid signals and obtain an original signal x.

Then, assuming that 3 layer decomposition is performed on the original signal, the energy of a signal in a j-th band in layer 3 is:

$$E_{3j} = \int |D_{3j}(t)|^2 dt = \sum_{k=1}^{l}|x_{jk}^n|^2, j = 0, 1, 2, \ldots, 7.$$

In the formula, l represents a data length, $D_{ij}$, represents a signal in a j-th sub-band in the layer 3 obtained after wavelet packet decomposition and reconstruction, and $x_{jk}^n$ represents the amplitude of a discrete point.

The sum of the energy values is:

$$E_3 = \sum_{j=0}^{7} E_{3j}, j = 0, 1, 2, \ldots, 7.$$

So the relative energy of the j-th band in layer n is:

$$E_{3j}^* = \frac{E_{3j}}{E_3}.$$

Wavelet energy entropy is defined as:

$$P = -\sum_{j} E_{3j}^* lg E_{3j}^*.$$

According to the formula, the energy entropy is calculated and a wavelet basis function with minimum energy entropy is selected.

In this case, sym10 is selected as an optimal wavelet base.

After the wavelet basis function is determined, the wavelet packet decomposition is performed on the input current and output current, the number of layers of the wavelet packet decomposition is selected as 3, the wavelet packet decomposition and reconstruction are performed on the original signal, and finally 8 sub-band signals representing the original signal are obtained, and then the energy of each sub-band signal is extracted to obtain an energy feature vector of an instability fault of each converter module:

$$X_i = \{, x_{i1}, x_{i2}, x_{i3}, \ldots, x_{i8}\}, i=1,2,3$$

S2. constructing an attribute graph G=(V, E, X) for the direct-current microgrid of this case, which is specifically as follows:

V is a set of the nodes, $$V=\{v_1, v_2, V_3\}$$

$v_1$ represents the Boost converter, $v_2$ represents the four-switch Buck-Boost converter, and $v_3$ represents the phase-shifted full-bridge converter.

E is a set of edges among the nodes, and the presence of power flows among the nodes represents the existence of edge connections. A direct-current bus voltage is provided for a bus voltage according to an output power of the Boost converter; power can be output from or input into the Buck-Boost converter; and power is input into the phase-shifted full-bridge converter. Therefore, an edge set among the nodes is constructed, $$E=\{(v_1, v_2), (v_1, v_3), (v_2, v_3)\}$$

$(v_1, v_2)$ indicates that there is a power flow relationship between the Boost converter and the four-switch Buck-Boost converter, $(v_1, v_3)$ indicates that there is a power flow relationship between the Boost converter and the phase-shifted full-bridge converter, and $(v_1, v_3)$ indicates that there is a power flow relationship between the Buck-Boost converter and the phase-shifted full-bridge converter.

X is a node feature matrix, which is consisted of a feature vector $X_i$ of each node.

$$X = \begin{Bmatrix} x_{11} & x_{12} & \ldots & x_{18} \\ x_{21} & x_{22} & \ldots & x_{28} \\ x_{31} & x_{32} & \ldots & x_{38} \end{Bmatrix}$$

A first step of each action is that each converter extracts a fault feature vector.

In addition, the adjacency matrix A is constructed according to a rule. Specifically, if the node converters at both ends of the edge have a power flow and the feature vectors are different, the weight is defined as 1, and otherwise, the weight is defined as 0. In the matrix, the values on the diagonal are always set to be 1.

For example, if collected sample 1 is a case that the Boost converter is unstable, the four-switch Buck-Boost converter is stable, and the phase-shifted full-bridge converter is stable, then the adjacency matrix is:

$$A = \begin{Bmatrix} 1 & 1 & 1 \\ 1 & 1 & 0 \\ 1 & 0 & 1 \end{Bmatrix}$$

S4. labeling each node according to whether the power electronic converter module is unstable, wherein if the converter is unstable, the label is (1, 0); and if the converter is stable, the label is (0, 1). Also taking the sample 1 as an example, the labels of node v1 at this time are y1=(1, 0), y2=(0, 1), y3=(0, 1). Then the electrical data of the power electronic converter is combined with the labels to form the data set. Under each fault type, data of 200 samples are collected, totally 1400 sets of samples of data, and 1080 sets of samples of data are randomly selected as a training set and 320 sets of samples of data as a test set. According to the sample data set, an optimal graph neural network is obtained through training.

S4-1. defining a graph convolutional network structure, wherein the number of graph convolutional layers is 2, an output dimension of a first layer is 16, an output dimension of a second layer is 8 (the hyperparameter is set according to a rule with a best average performance in a plurality of tests), an activation function σ is ReLU, an output layer is a fully connection layer containing 2 neurons, and a Softmax function is connected.

S4-2. initializing parameters: randomly initializing the weight of each layer of the graph convolutional network, wherein W represents a weight parameter of a k-th layer.

S4-3. performing forward propagation:
through the convolution layer of the first layer diagram, the node feature representation matrix $H^1$ of the first layer with 3×16 dimensions is obtained. The relationship between the feature representation $H_i^1$ of the i node (i=1,2,3) and the input node vector X, is shown as follows:

$$H_i^1 = \sigma\left(\sum_{j \in L(i)} \frac{A_{ij}}{\sqrt{D_{ii}D_{jj}}} X_j W^1 + \frac{1}{D_{ii}} X_i W^1\right)$$

$A_{ij}$ is a weight of each edge in the adjacency matrix; L(i) represents all nodes connected to i; $D_{ii}$ and $D_{jj}$ are the degree values on the diagonal of the degree matrix, $$D_{ii} = \sum_{q=1}^{3} A_{iq}, D_{jj} = \sum_{q=1}^{3} A_{jq};$$

$W^1$ represents a network weight of the first layer; $X_j$ is an input feature vector for the i-th node; and σ(.) is the activation function ReLU.

Through the graph convolution layer of the second layer, the node feature representation matrix $H^2$ of the second layer with 3×8 dimensions is obtained. A specific operation is similar to that of the first layer, which is mainly calculated according to the following formula:

$$H_i^2 = \sigma\left(\sum_{j \in L(i)} \frac{A_{ij}}{\sqrt{D_{ii}D_{jj}}} H_j^1 W^2 + \frac{1}{D_{ii}} H_j^1 W^2\right)$$

$A_{ij}$ is a weight of each edge in the adjacency matrix; L(i) represents all nodes connected to i; $D_{ii}$ and $D_{jj}$ are the degree values on the diagonal of the degree matrix, $$D_{ii} = \sum_{q=1}^{3} A_{iq}, D_{jj} = \sum_{q=1}^{3} A_{jq};$$

$W^2$ represents a network weight of the first layer; $H_i^1$ is a feature representation for the i-th node output by the first layer; and σ(.) is the activation function ReLU.

Through the fully connection layer, an output Z of a third layer with 3×2 dimensions is obtained. An output vector of node i (i=1,2,3) is as follows:

$$z_i = \sum_{j \in L(i)} \frac{A_{ij}}{\sqrt{D_{ii}D_{jj}}} H_j^2 W^3 + \frac{1}{D_{ii}} H_j^2 W^3.$$

After normalization by utilizing the softmax function, classification prediction is performed, and prediction labels of the nodes are expressed as ŷ.

S4-4. constructing a loss function according to the output prediction labels and actual node labels, wherein the loss function is constructed as follows:

$$O = \frac{1}{3} \sum_{i=1}^{3} (\hat{y}_i, y_i)$$

$\hat{y}_i$ is a prediction label of a node i, $y_i$ is an actual label of the node i, loss(, ) is a cross entropy loss function.

S4-5. reversely adjusting the weight matrix W by the gradient descent method.

S4-6. training iteratively: repeating S4-3 to S4-5 until the model converges, i.e. a preset number of iterations is reached or the model performance is no longer significantly improved.

S5. after the trained graph convolutional neural network model is obtained, deploying the model to an actual direct-current microgrid for online diagnosis, wherein an instability fault situation of each power electronic converter module can be directly determined through the collected electrical data. In this case, if the result returned is that the label of the node $v_1$ is (1, 0), the label of the node $v_2$ is (1, 0), and the label of the node $v_3$ is (0, 1), then it is proved that the Boost converter is unstable, the four-switch Buck-Boost converter is unstable, and the phase-shifted full-bridge converter is stable. At this time, it is enough to repair the Boost converter and four-switch Buck-Boost converter, which greatly saves manpower and material resources and realizes automatic detection.

In summary, the method provided by the present invention can solve a defect that the traditional method cannot locate the instability source of the direct-current microgrid, and can not only guide the instability determination of the whole direct-current microgrid, but also accurately locate each converter. In addition, in the process of constructing the graph attributes, the electrical feature of each converter is combined, and the adjacency matrix is updated with the comparison model, which simplifies the calculation and has a practical and wide application prospect.

Also provided in an embodiment is a device for locating an instability fault source in a direct-current microgrid, comprising a computer memory, a computer processor and a computer program stored in the computer memory and executable on the computer processor, wherein the computer memory adopts any one of the graph theory-based methods for locating an instability fault source in a direct-current microgrid provided in the above-mentioned embodiments.

The following steps are implemented when the computer processor executes the computer program: inputting the electrical data of each power electronic converter of the direct-current grid to be diagnosed into the grid diagnosis model to output a judgment result of whether the direct-current grid is unstable and an existing instability fault source.

A person skilled in the art should understand that embodiments of this application may be provided as methods, systems, or computer program products. Therefore, this application may take a form of a full hardware embodiment, a full software embodiment, or a software and hardware combined embodiment. Further, this application may take a form of a computer program product implemented on one or more computer available storage media (comprising but not limited to a disk memory, a CD-ROM, an optical memory, etc.) in which computer available program codes are contained. The solution in the embodiments of this application may be implemented in various computer languages, such as object-oriented programming language Java and literal scripting language JavaScript.

This application is described by reference to flow charts and/or block diagrams of methods, devices (systems), and computer program products based on the embodiments of this application. It should be understood that each process and/or block in a flowchart and/or block diagram, and a combination of processes and/or blocks in the flowchart and/or block diagram, can be implemented by computer program instructions. These computer program instructions may be supplied to a general-purpose computer, a dedicated computer, an embedded processor, or a processor of other programmable data processing device to produce a machine, so that the instructions are executed by the computer or the processor of other programmable data processing device to produce a means having a function specified in one or more processes in the flowchart and/or one or more blocks in the block diagram.

These computer program instructions may also be stored in a computer-readable memory capable of directing a computer or other programmable data processing device to operate in a particular manner such that the instructions stored in such computer-readable memory produce a manufactured product comprising an instruction means, the instruction means implements a function specified in one or more processes in a flowchart and/or one or more blocks in a block diagram. These computer program instructions may also be loaded onto a computer or other programmable data processing device, such that a series of operational steps are performed on the computer or other programmable data processing device to produce computer-implemented processing. Therefore, the instructions executed on the computer or other programmable device provide steps to implement a function specified in one or more processes in a flowchart and/or one or more blocks in a block diagram.

The present invention significantly improves a maintenance level of the direct-current distribution network, and through the advanced automatic diagnosis technology, not only improves the stability detection and adjustment ability of the system operation, but also ensures the high efficiency and high accuracy of the maintenance work. This innovation is of great value in engineering applications, and shows extensive promotion and application potential. It not only optimizes the performance of existing systems, but also provides an efficient and reliable maintenance solution for the future development of grid technology.

Finally, it should be noted that the above embodiments are only specific implementations of the present invention, which are used to illustrate the technical solution of the present invention, without restriction to it, and the protection scope of the present invention is not limited to this, although the present invention is described in detail by reference to the above-mentioned embodiments, a person skilled in the art should understand that: within the technical scope disclosed by the present invention, any technical person familiar with the technical field can still modify or easily think of changes in the technical solution recorded in the above-mentioned embodiments, or equivalent replacement of part of the technical features therein. Such modifications, changes or replacements shall not depart the essence of the corresponding technical solution from the spirit and scope of the technical solution of the embodiments of the present invention, and shall be covered within the protection scope of the present invention. Therefore, the protection scope of the present invention shall be subject to the protection scope of the claims.

What is claimed is:

1. A graph theory-based method for locating an instability fault source in a direct-current microgrid, comprising the following steps:
measuring and obtaining electrical data of each power electronic converter in the direct-current microgrid, and processing the electrical data to obtain a corresponding feature vector;
constructing a graph model based on the direct-current microgrid, wherein the graph model takes the power electronic converters as nodes, power flow paths among all the power electronic converters as edges among the nodes, and the feature vectors corresponding to the power electronic converters as a node feature matrix; wherein a specific structure of the graph model is as follows:
setting G=(V, E, X) to represent an attribute graph in the graph model, wherein V represents a set of the nodes, that is, one power electronic converter represents one node; and N is a total number of the nodes;

E represents a set of the edges among the nodes, that is, the power flow paths among all the power electronic converters are taken as node edges; an adjacency matrix A represents a set of the edges among the nodes and meets $A \in \square^{N \times N}$; when there is a power flow between a node i and a node j and i≠j, a matrix $A_{ij}$ is set to 1, and otherwise the matrix $A_{ij}$ is set to 0; and in addition, $A_{ii}$ is set to 1; and X represents the node feature matrix, and meets $X \in \square^{N \times C}$; and C represents feature dimensions of the nodes;

according to whether the direct-current microgrid is unstable, labeling the electrical data of the power electronic converters, and combining the electrical data and labels of the power electronic converters into data sets;

introducing the graph model into a pre-constructed graph convolutional neural network framework to construct a corresponding classification network, which comprises a feature extraction module, a feature fusion module, and a classification module, wherein the feature extraction module is configured to obtain electrical change data of the power electronic converters and position information in the corresponding graph model to generate a feature vector corresponding to the electrical change data and a node vector corresponding to the position information;

the feature fusion module is configured to generate a corresponding node feature representation according to the generated feature vector and node vector; and the classification module is configured to output a classification result according to the input node feature representation, wherein the classification result comprises whether a direct-current grid is unstable and an instability fault source; wherein an expression of the node feature representation is as follows:

$$H = D^{-\frac{1}{2}} A D^{-\frac{1}{2}} X W,$$

wherein D represents a degree matrix, each $$D_{ii} = \sum_{j=1}^{N} A_{ij};$$

A represents an updated adjacency matrix, $A \in \square^{N \times N}$; X represents the node feature matrix, $X \in \square^{N \times C}$; N represents a total number of the nodes; W represents a weight matrix, $W \in \square^{C \times F}$; F represents feature vector dimensions extracted by all the convolution layers; and H represents node feature representation extracted by convolution of all the convolution layers, $H \in \square^{N \times F}$;

wherein the weight matrix is constructed by comparing feature vectors of two nodes connected by each edge between nodes, which is specifically as follows:

if feature vectors of the nodes at both ends of the edge are different, defining a weight as 1; and if feature vectors of the nodes at both ends of the edge are same, defining the weight as 0;

utilizing the data set to train the classification network to obtain a grid diagnosis model for instability diagnosis of the direct-current grid; and during training, parameters of the classification network are updated by using a cross entropy loss function, wherein an expression of the cross entropy loss function is as follows:

$$O = \frac{1}{N} \sum_{i=1}^{N} (\hat{y}_i, y_i),$$

wherein $\hat{y}_i$ represents a predicted label of a node i, $y_i$ represents an actual label of the node i, and N is a total number of the nodes;

inputting the electrical data of each power electronic converter of the direct-current grid to be diagnosed into the grid diagnosis model;

outputting a judgment result of whether the direct-current grid is unstable and an existing instability fault source;

locating one or more faulty power electronic converters;

replacing the one or more faulty power electronic converters;

wherein the power electronic converters include direct-current to direct-current converters for adjusting voltage levels, inverters for converting direct-current to alternating-current, and bidirectional converters for controlling energy storage; and wherein types of instability faults are converter single operation instability or converter cascade operation instability.

2. The graph theory-based method for locating an instability fault source in a direct-current microgrid according to claim 1, wherein a specific process of processing the electrical data is as follows:

setting a wavelet basis function based on energy entropy to perform multi-layer decomposition on the electrical data through the wavelet basis function, and calculating the energy of sub-bands after the multi-layer decomposition to construct the corresponding feature vector.

3. The graph theory-based method for locating an instability fault source in a direct-current microgrid according to claim 1, wherein the electrical data comprises a current signal and a voltage signal.

4. A device for locating an instability fault source in a direct-current microgrid, comprising a computer memory, a computer processor, and a computer program stored in the computer memory and executable on the computer processor, wherein the computer memory adopts the graph theory-based method for locating an instability fault source in a direct-current microgrid according to claim 1; and the following steps are implemented when the computer processor executes the computer program: inputting the electrical data of each power electronic converter of the direct-current grid to be diagnosed into the grid diagnosis model to output a judgment result of whether the direct-current grid is unstable and an existing instability fault source.

5. The graph theory-based method for locating an instability fault source in a direct-current microgrid according to claim 1, wherein the power electronic converters are one Boost converter with a first end connected to a solar panel, and a second end connected to a direct-current bus; one four-switch Buck-Boost converter with a first end connected to an energy storage device, and a second end connected to the direct-current bus; and one phase-shifted full-bridge converter with a first end connected to the direct-current bus, and a second end connected to a direct-current load.

6. A device for locating an instability fault source in a direct-current microgrid, comprising a computer memory, a computer processor, and a computer program stored in the computer memory and executable on the computer processor, wherein the computer memory adopts the graph theory-based method for locating an instability fault source in a direct-current microgrid according to claim 5; and the following steps are implemented when the computer processor executes the computer program: inputting the electrical data of each power electronic converter of the direct-current grid to be diagnosed into the grid diagnosis model to output a judgment result of whether the direct-current grid is unstable and an existing instability fault source.

\* \* \* \* \*